United States Patent
Behrends et al.

(10) Patent No.: US 7,418,637 B2
(45) Date of Patent: Aug. 26, 2008

(54) METHODS AND APPARATUS FOR TESTING INTEGRATED CIRCUITS

(75) Inventors: Derick G. Behrends, Rochester, MN (US); Peter T. Freiburger, Rochester, MN (US); Ryan C. Kivimagi, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 713 days.

(21) Appl. No.: 10/636,060

(22) Filed: Aug. 7, 2003

(65) Prior Publication Data

US 2005/0034037 A1    Feb. 10, 2005

(51) Int. Cl.
*G11C 29/00* (2006.01)
(52) U.S. Cl. ..................................... 714/718
(58) Field of Classification Search .................. 714/718
See application file for complete search history.

(56) References Cited

U.S. PATENT DOCUMENTS 5,781,488 A * 7/1998 Liu et al. ..................... 365/207
6,853,597 B2 * 2/2005 Jain ............................ 365/201

FOREIGN PATENT DOCUMENTS

| JP | 04-248642 | 9/1992 |
|---|---|---|
| JP | 06-052697 | 2/1994 |
| JP | 06-096599 | 4/1994 |
| JP | 07-288457 | 10/1995 |
| JP | 09-007393 | 1/1997 |
| JP | 09-120687 | 5/1997 |
| JP | 2002-216483 | 8/2002 |
| JP | 2002-260400 | 9/2002 |
| JP | 2003-133931 | 5/2003 |
| JP | 2004-110870 | 4/2004 |
| WO | 94/18677 | 8/1994 |

* cited by examiner

*Primary Examiner*—James C. Kerveros
(74) *Attorney, Agent, or Firm*—Dugan & Dugan

(57) ABSTRACT

In some aspects a method is provided for testing an integrated circuit (IC). The method includes the steps of selecting a bit from each of a plurality of memory arrays formed on an IC chip, selecting one of the plurality of memory arrays, and storing the selected bit from the selected memory array. Numerous other aspects are provided.

12 Claims, 5 Drawing Sheets

METHODS AND APPARATUS FOR TESTING INTEGRATED CIRCUITS

FIELD OF THE INVENTION

The present invention relates generally to integrated circuit design, and more specifically to methods and apparatus for testing integrated circuits.

BACKGROUND OF THE INVENTION

An integrated circuit (IC) chip may include one or more memory arrays used to store data. The one or more memory arrays may be grouped in one or more sets. To test such a chip, an ABIST test may be performed on the IC chip (e.g., to determine whether the IC chip includes any defects). During an ABIST test, a pattern of data is provided to the IC chip and written into one or more of the memory arrays (e.g., each memory array in a set of memory arrays). The data then is read out of the one or more memory arrays and compared to the data written into the one or more memory arrays. The resulting information is used to determine whether a failure occurred in one or more of the memory arrays.

An IC chip may include additional circuitry for performing an ABIST test. In one conventional testing configuration, a different latch (e.g., an observation latch) is coupled to each memory array for storing data that is read from the memory array. In this manner, the pattern of data written into a memory array may be read out of the memory array and stored in the observation latch associated with the memory array.

Because each observation latch occupies a large amount of space on an IC chip, including an observation latch for each memory array of the IC chip consumes a sizeable amount of real estate or floor plan area of the IC chip. Accordingly, methods and apparatus for testing integrated circuits that consume less chip real estate would be desirable

SUMMARY OF THE INVENTION

In a first aspect of the invention, a first method is provided for testing an integrated circuit (IC). The first method includes the steps of (1) selecting a bit from each of a plurality of memory arrays formed on an IC chip; (2) selecting one of the plurality of memory arrays; and (3) storing the selected bit from the selected memory array.

In a second aspect of the invention, a second method is provided for testing an integrated circuit (IC). The second method includes the steps of (1) selecting a bit from each of a first and second plurality of memory arrays formed on an IC chip; (2) selecting one memory array from each of the first and second plurality of memory arrays; and (3) storing the selected bit from the selected memory array for each of the first and second plurality of memory arrays.

In a third aspect of the invention, a first apparatus is provided that includes a plurality of memory arrays, a latch and a selection circuit coupled to the plurality of memory arrays and to the latch. The selection circuit is adapted to (1) receive a bit from each of the plurality of memory arrays; (2) select one of the plurality of memory arrays; and (3) store the bit from the selected memory array.

In a fourth aspect of the invention, a second apparatus is provided that includes a first plurality of memory arrays, a first latch and a first selection circuit coupled to the first plurality of memory arrays and to the first latch. The first selection circuit is adapted to (a) receive a bit from each of the first plurality of memory arrays; (b) select one of the first plurality of memory arrays; and (c) store the bit from the selected one of the first plurality of memory arrays.

The second apparatus also includes a second plurality of memory arrays, a second latch and a second selection circuit coupled to the second plurality of memory arrays and to the second latch. The second selection circuit is adapted to (d) receive a bit from each of the second plurality of memory arrays (e) select one of the second plurality of memory arrays; and (f) store the bit from the selected one of the second plurality of memory arrays. Numerous other aspects are provided in accordance with these and other aspects of the invention.

Other features and aspects of the present invention will become more fully apparent from the following detailed description, the appended claims and the accompanying drawings.

DETAILED DESCRIPTION

Figure 1:
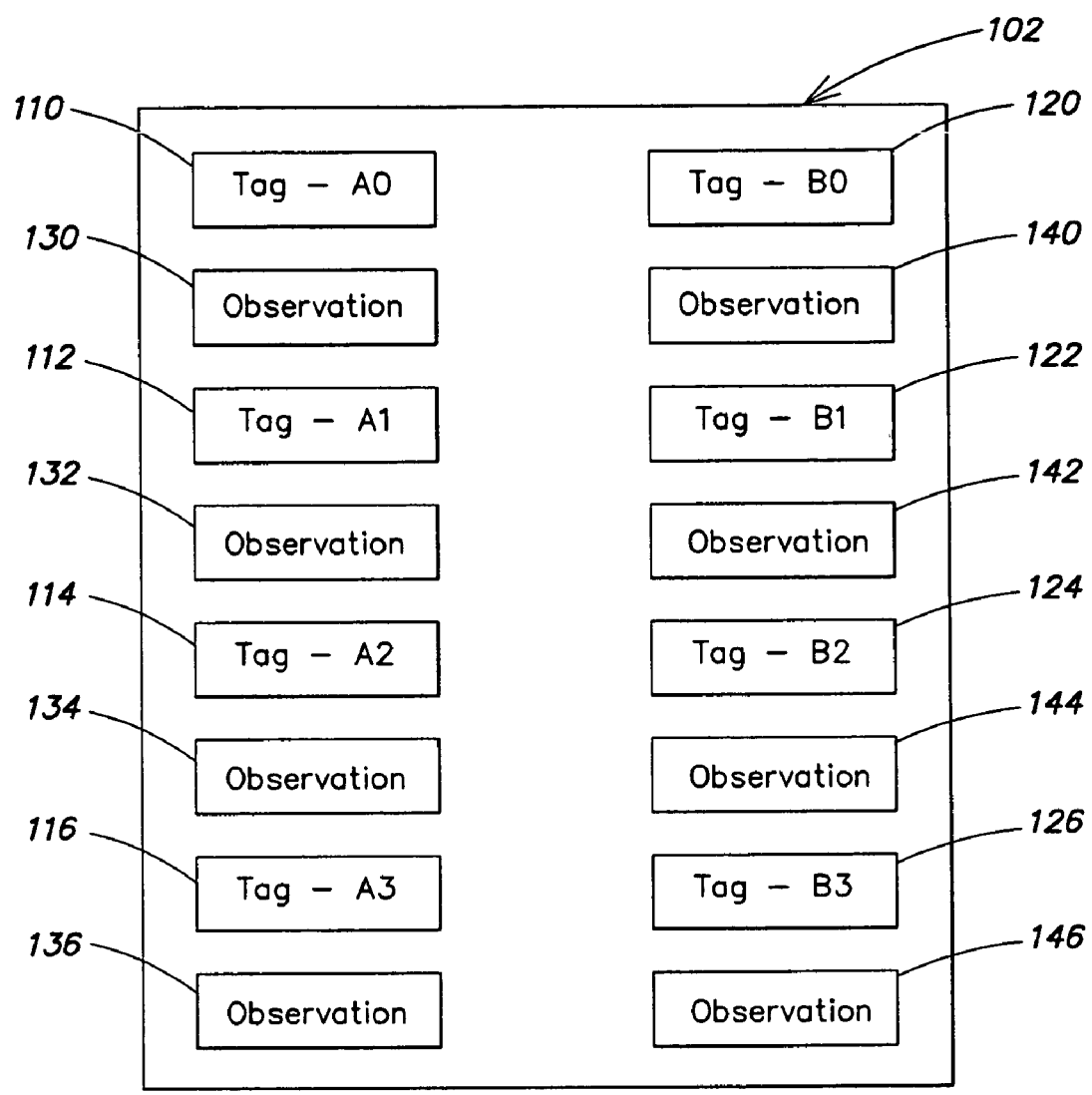
FIG. 1 is a block diagram of a conventional IC chip on which an ABIST test may be performed.

FIG. 1 is a block diagram of a conventional IC chip on which an ABIST test may be performed. The conventional IC chip 102 may include one or more memory arrays 110 (Tag-A0), 112 (Tag-A1), 114 (Tag-A2), 116 (Tag-A3), 120 (Tag-B0), 122 (Tag-B1), 124 (Tag-B2), 126 (Tag-B3) used to store data. In one embodiment, the conventional IC chip may include eight memory arrays. Other numbers of memory arrays may be employed.

During an ABIST test, a pattern of data may be sent to the IC chip 102 and written into one or more of the memory arrays 110-126 of the IC chip 102. Thereafter, the data is read out of the one or more memory arrays 110-126 and compared to the data written to the one or more memory arrays 110-126. Any discrepancy therebetween may indicate/identify a failure or defective memory array.

The conventional IC chip 102 may include a different latch (e.g., an observation latch) 130, 132, 134, 136, 140, 142, 144, 146 coupled to each memory array 110-126, respectively, for storing data read out of each memory array during ABIST testing. In the embodiment where the conventional IC chip includes eight memory arrays, the conventional IC chip may include eight latches. As stated, including an observation latch for each memory array consumes a sizeable amount of real estate of the IC chip 102.

Figure 2:
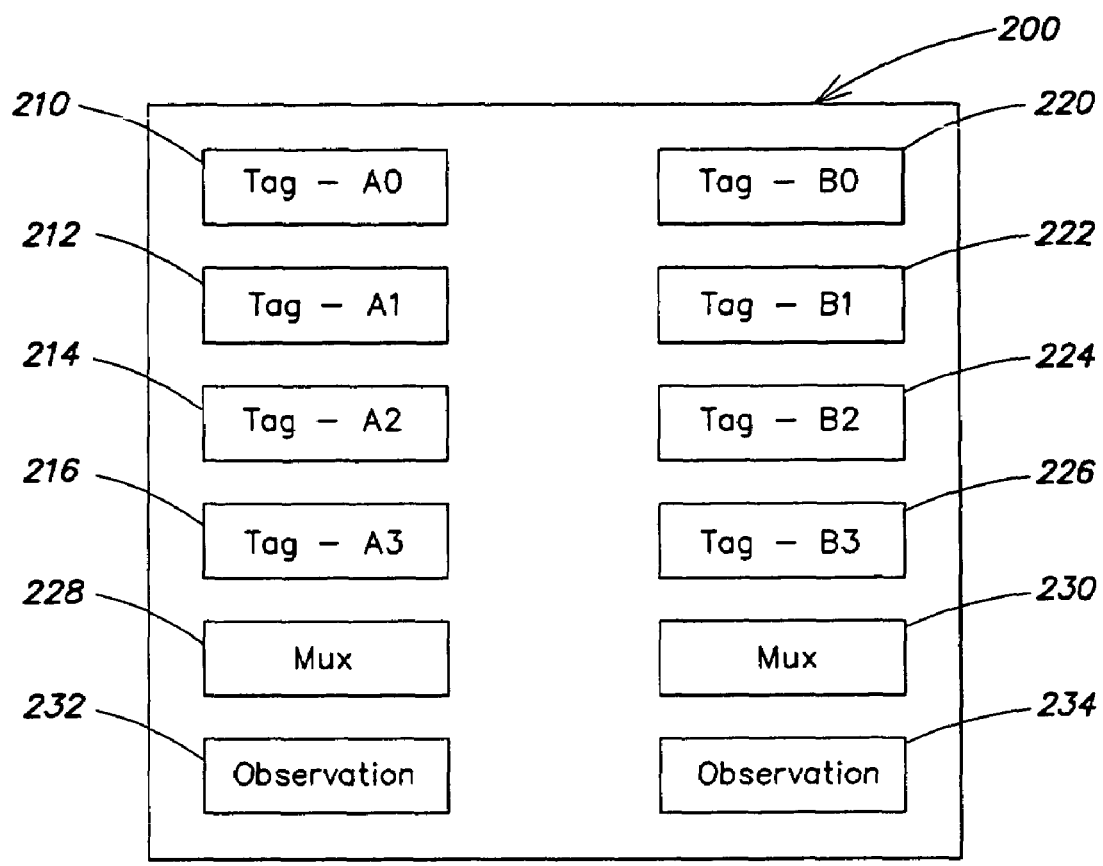
FIG. 2 is a block diagram of a novel IC chip on which an ABIST test nay be performed in accordance with the present invention.

FIG. 2 is a block diagram of a novel IC chip 200 on which an ABIST test may be performed in accordance with the present invention. The IC chip 200 may include a first plurality of memory arrays 210 (Tag-A0), 212 (Tag-A1), 214 (Tag-A2), 216 (Tag-A3). Other numbers of memory arrays may be employed.

As will be described further below, during an ABIST test, a pattern of data may be sent to the IC chip 200 and written to one or more of the memory arrays 210-216 of the IC chip 200.

Each of the one or more memory arrays 210-216 then may output the data that was written into the memory array 210-216. The data output from a memory array may be compared to the data written to the memory array to identify a failure or defect in the memory array. The structure of each memory array will be described below with reference to FIG. 3.

The first plurality of memory arrays 210-216 may be coupled to a first latch 232 (e.g., an observation latch) via a first multiplexer circuit 228. The first multiplexer circuit 228 may selectively output data from one of the plurality of memory arrays 210-216 to be stored in the first latch 232. Therefore, an ABIST test may be performed on that memory array of the IC chip 200 by comparing the data stored in the first latch 232 (e.g., the data output by the memory array) with the data written to the memory array.

As stated, the first plurality of memory arrays 210-216 may be coupled to the multiplexer circuit 228. More specifically, the output of each of the first plurality of memory arrays 210-216 may be provided to the first multiplexer circuit 228 as data inputs. The output of each memory array may be one or more bits. Based on signals (e.g., select signals) input to the first multiplexer circuit 228, the first multiplexer circuit 228 may selectively output data input to the first multiplexer circuit 228 by one of the memory arrays 210-216. The first latch 232 then stores the data output by the first multiplexer circuit 228. In one embodiment, each memory array 210-216 outputs thirty-four bits of data. Therefore, the first observation latch 232 may store thirty-four bits of data output from one of the memory arrays 210-216. Other memory array and/or observation latch sizes may be employed.

Using the novel IC chip 200, the data output from one of a plurality of memory arrays may be selected, stored, and observed. The above task is accomplished by the novel IC chip 200 without requiring a separate latch for each memory array 210-216. Consequently, the novel IC chip 200 may require fewer latches to perform an ABIST test than the conventional IC chip 100. By reducing the number of latches included in the IC chip on which an ABIST test may be performed, less chip real estate is consumed.

In one embodiment, the IC chip 200 may include a second plurality of memory arrays 220 (Tag-B0), 222 (Tag-B1), 224 (Tag-B2), 226 (Tag-B3) coupled to a second latch (e.g., an observation latch) 234 via a second multiplexer circuit 230. The output of each of the second plurality of memory arrays 220-226 may be provided to the second multiplexer circuit 230 as data inputs. The second multiplexer circuit 230 then may selectively output data input from one of the second plurality of memory arrays 220-226 to be stored in the second latch 234 in a manner similar to that described above with reference to the first plurality of memory arrays 210-216, the first multiplexer circuit 228, and the first latch 232.

In at least one embodiment of the invention, data output from one of the first plurality of memory arrays 210-216 may be selected (via the first multiplexer circuit 228) and stored in the first latch 232 and data output from one of the second plurality of memory arrays 220-226 may be selected (via the second multiplexer circuit 230) and stored in the second latch 234 simultaneously (e.g., in parallel). Therefore, an ABIST test may be performed simultaneously on more than one memory array. More specifically, a memory array from the first plurality of memory arrays 210-216 and a memory array from the second plurality of memory arrays 220-226 may be included in a set. For example, memory arrays 210 and 220, 212 and 222, 214 and 224, and 216 and 226 may be included in a first, second, third and fourth set, respectively. The ABIST test may be performed simultaneously (e.g., in parallel) on all memory arrays included in a set.

Exemplary structure of the memory array 210 will now be described with reference to FIG. 3. The memory arrays 212-226 may be similarly configured.

Figure 3:
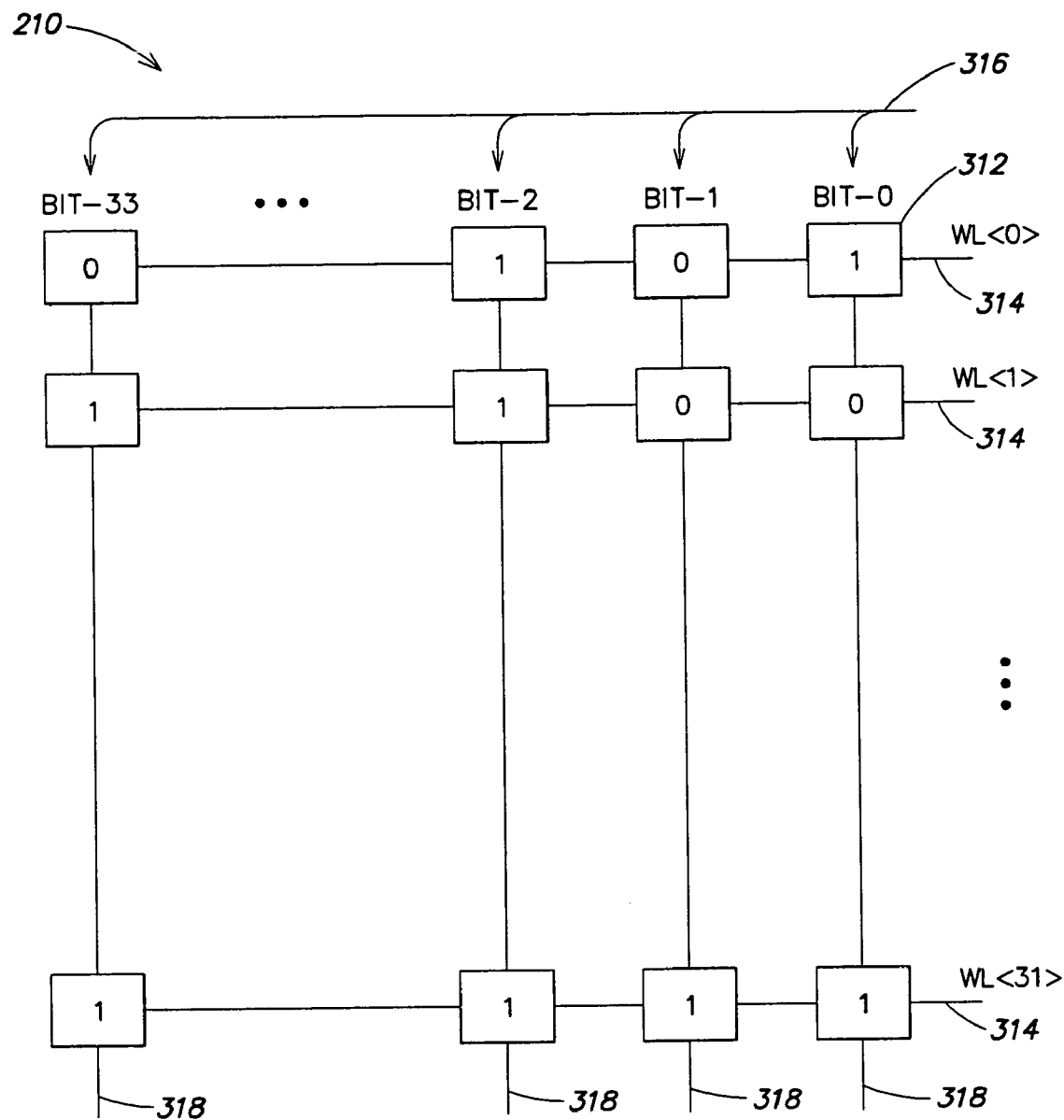
FIG. 3 is a schematic diagram of exemplary structure of a memory array of the IC chip of FIG. 2.

With reference to FIG. 3, the memory array 210 includes a plurality of rows (e.g., word lines 314) that intersect a plurality of columns (e.g., bit lines 316). In one embodiment, the memory array 210 may include thirty-two word lines and thirty-four bit lines. Other numbers of word lines 314 and/or bit lines 316 may be included in the memory array 210. The memory array 210 may include an SRAM or similar cell 312 at the intersection (e.g., junction) of each word line 314 and each bit line 316 for storing one or more bits of data.

The memory array 210 may include a global dot line 318 coupled to each bit line 316 for outputting data. More specifically, for each bit line 316 the memory array 210 outputs data (stored in a memory cell 312 at the junction of the bit line 316 and a selected word line 314) via the global dot line 318 coupled to the bit line 316. Data may be selected to be output from the memory array 210 by selecting a word line 314. For example, if word line "0" (WL<0>) is selected in the memory array 210, data stored in the memory cell 312 at the junction of word line "0" and each bit line 316 will be written to and thereafter output from the global dot line 318 corresponding to each bit line 316. In the exemplary embodiment of FIG. 3, the data output from the memory array 210 via the global dot line 318 corresponding to bit lines 0-33 of word line 0 is "1", "0", "1" . . . "0", respectively. Consequently, by selecting a word line in the memory array 210, thirty-four bits of data may be selected to be output from the memory array 210 (via the global dot lines 318). As stated, each of the memory arrays 210-226 shown in FIG. 2 may operate in a similar manner to output data, and each may output data simultaneously.

Figure 4:
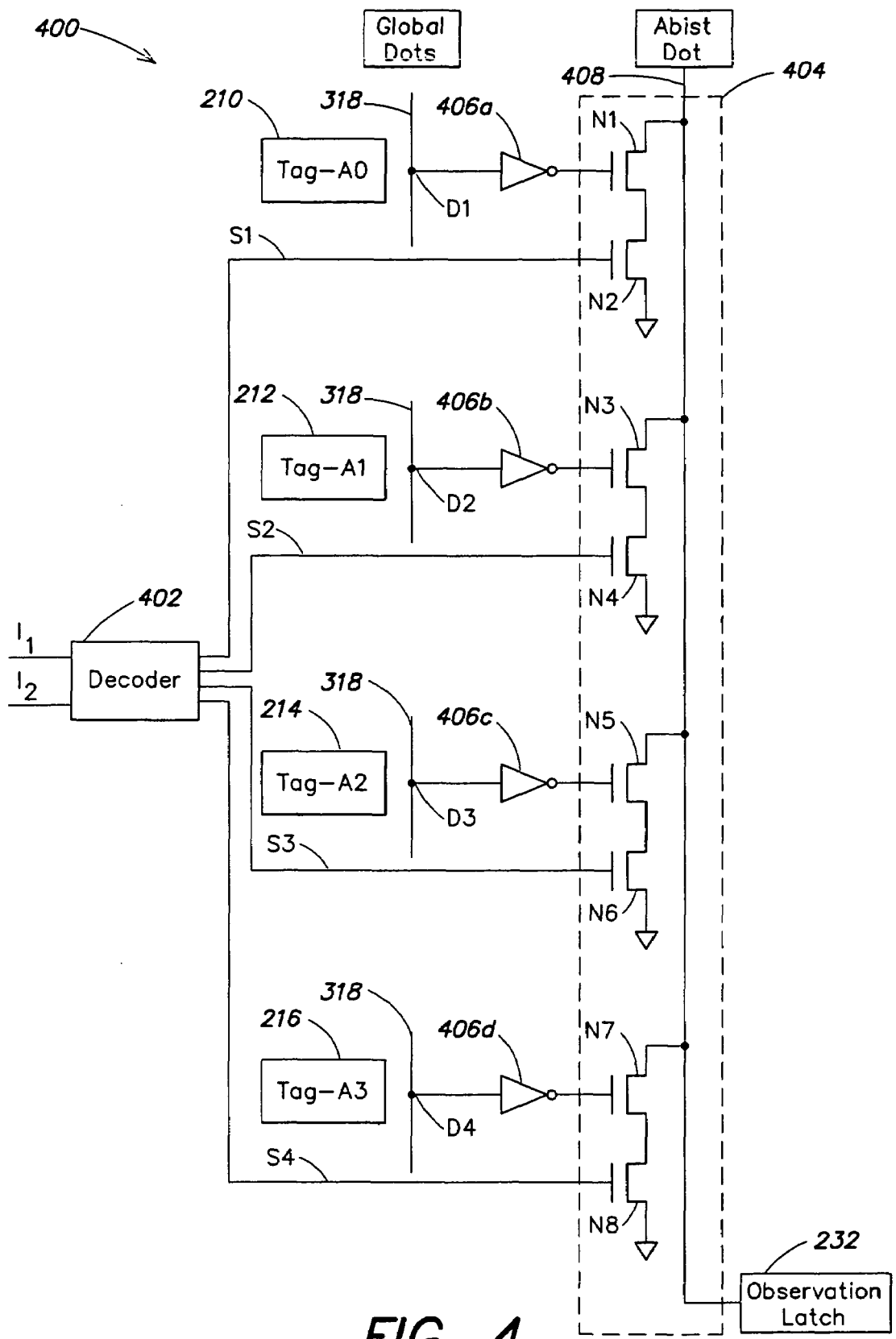
FIG. 4 illustrates an exemplary selection circuit used to select a bit of data from a first plurality of memory arrays of the IC chip of FIG. 2.

FIG. 4 illustrates an exemplary selection circuit 400 used to select a bit of data from the first plurality of memory arrays 210-216 and store the bit of data in the first observation latch 232. In at least one embodiment, one such circuit 400 is provided for each global dot line from which data may be output from a memory array. For example, if each memory array 210-216 includes 34 bit lines, 34 selection circuits 400 may be employed to select all 34 bits that may be output by a memory array. Consequently, all of the data output from one of the first plurality of memory arrays 210-216 (via the global dot lines 318) may be selectively output and stored using the selection circuits 400. The selection circuits 400 may be employed by the second plurality of memory arrays 220-226 in a manner similar to that employed by the first plurality of memory arrays 210-216.

With reference to FIG. 4, the selection circuit 400 may be coupled to a decoder 402. The decoder 402 may receive input signals and generate a plurality of selection signals as is known in the art. For example, the decoder 402 may receive two input signals 11, 12 and output four selection signals S1, S2, S3, S4.

The selection circuit 400 may include a multiplexer 404 coupled to the decoder 402; and the selection signals S1, S2, S3, S4 output by the decoder 402 may be input to the multiplexer 404 and serve as select signals for the multiplexer 404. The multiplexer 404 is also coupled to a global dot line 318 of each of the first plurality of memory arrays 210-216 via a plurality of inverters 406 a-d, respectively. One global dot line 318 of each of the first plurality of memory arrays 210-216 (collectively referred to as global dots in FIG. 4) is input to the multiplexer 404 as data signals D1, D2, D3, D4. In one embodiment, the multiplexer 404 selects one of the four input signals D1, D2, D3, D4 to output based on the select signals S1, S2, S3, S4. Other numbers of select signals and/or data signals may be used. The observation latch 232 stores the data (e.g., one bit) output by the multiplexer 404.

The multiplexer 404 includes a plurality of stacked transistors N1-N8. The number of stacked transistors is based on the number of memory arrays from which data is input to the multiplexer 404. In one embodiment, the multiplexer 404 includes four pairs of stacked transistors and provides 4-to-1 multiplexing. Other sizes may be employed. As shown in FIG. 4, a first pair of stacked transistors may include a first n-channel metal-oxide-semiconductor field-effect transistor (NFET) N1 coupled to a global dot line of memory array 210 (via inverter 406a) and an ABIST dot output line 408. The first pair of stacked transistors may include a second NFET N2 coupled to the first NFET N1 and ground. The gate of the second NFET N2 is coupled to the select signal S1 and is used to select the output of memory array 210 for output on the ABIST dot output line 408.

Similarly, a second pair of stacked transistors may include a third NFET N3 coupled to a global dot line of memory array 212 (via inverter 406b) and the ABIST dot output line 408. The second pair of stacked transistors may include a fourth NFET N4 coupled to the third NFET N3 and ground. The gate of the fourth NFET N4 is coupled to the select signal S2 and is used to select the output of memory array 212 for output on the ABIST dot output line 408.

A third pair of stacked transistors may include a fifth NFET N5 coupled to a global dot line of memory array 214 (via inverter 406c) and the ABIST dot output line 408. The third pair of stacked transistors may include a sixth NFET N6 coupled to the first NFET N5 and ground. The gate of the sixth NFET N6 is coupled to the select signal S3 and is used to select the output of memory array 214 for output on the ABIST dot output line 408.

Similarly, a fourth pair of stacked transistors may include a seventh NFET N7 coupled to a global dot line of memory array 26 (via inverter 406d) and the ABIST dot output line 408. The fourth pair of stacked transistors may include an eighth NFET N8 coupled to the seventh NFET N7 and ground. The gate of the eighth NFET N8 is coupled to the select signal S4 and is used to select the output of memory array 216 for output on the ABIST dot output line 408. Operation of the multiplexer 404 is described below.

It should be noted that in one embodiment of the invention each of the data signals input to the multiplexer 404 may be coupled to pull-up circuitry (not shown) so that, the initial state value of each of the data signals D1, D2, D3, and D4 is a logic "1" (e.g., of a high logic state). Similarly, the ABIST dot output line may be coupled to pull-up circuitry (not shown) so that, the initial state value of the ABIST dot output line 408 is a logic "1" (e.g., of a high logic state).

Using a plurality of the selection circuits 400 shown in FIG. 4, data from any one of the first plurality of memory arrays 210-216 may be selectively output and stored in the observation latch 232. For example, each selection circuit 400 may selectively output one bit from one memory array to the observation latch 232, and providing a plurality of the selection circuits 400 may allow all bits output by a memory array to be selectively output to and stored by the observation latch 232. The first multiplexer 228 thereby may be embodied at least in part as a plurality of selection circuits 400. The second multiplexer 230 may be similarly embodied with regard to the memory arrays 220-226 and the second observation latch 234.

Figure 5:
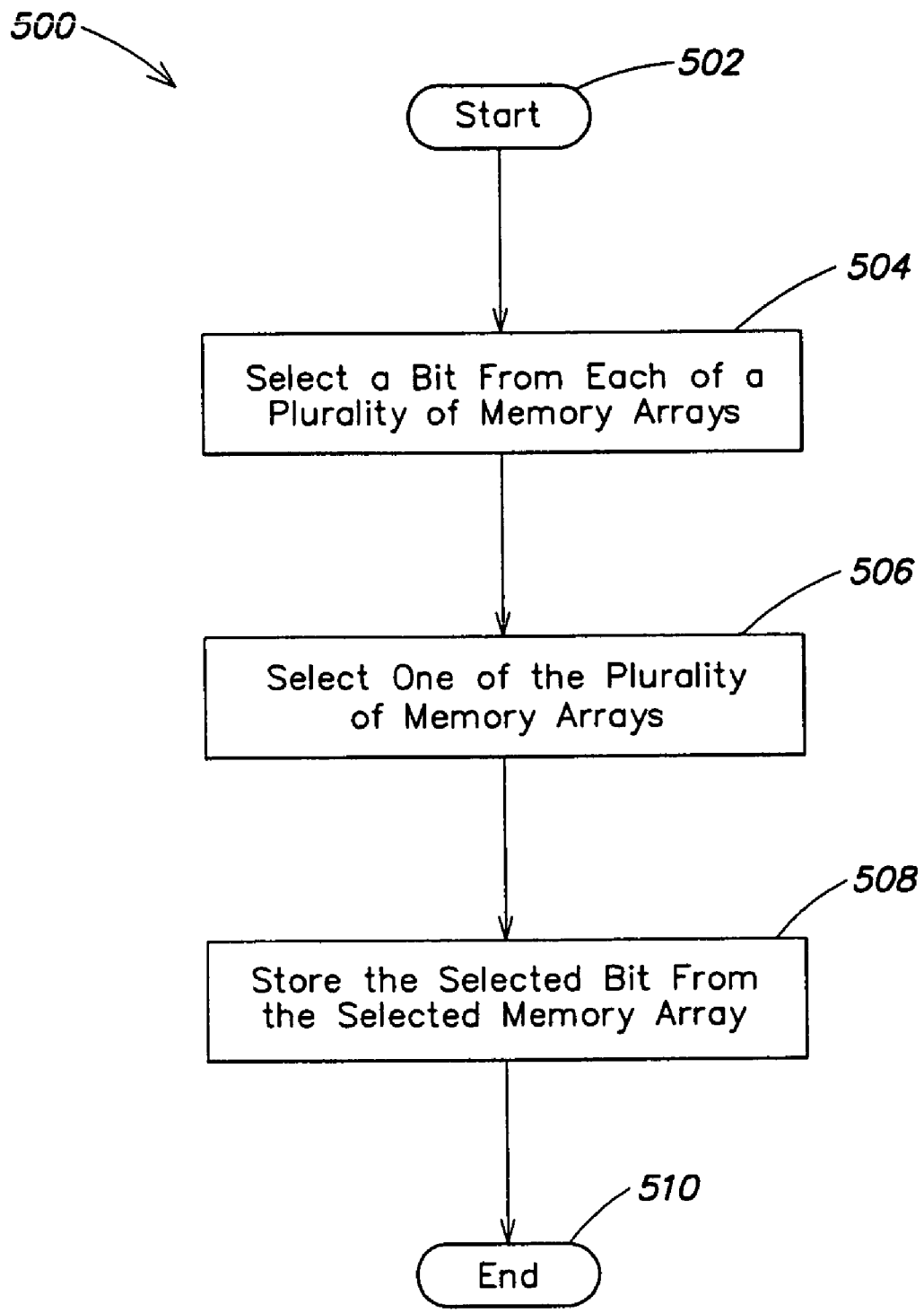
FIG. 5 illustrates an exemplary operation of the IC chip of FIG. 2.

The operation of the novel IC chip 200 is now described with reference to FIGS. 2-4, and with reference to FIG. 5 which illustrates an exemplary operation of the IC chip 200. With reference to FIG. 5, in step 502 the method 500 begins.

In step 504, a bit from each of a plurality of memory arrays is selected. As described with reference to FIG. 3, for a given bit line 316, a bit may be selected from a memory array by selecting a word line 314 of the memory array. The memory array may output the data stored in the memory cell 312 at the junction of the word line and the given bit line on a global dot line 318 that is coupled to the given bit line.

In at least one embodiment, the bit selected from each of the first plurality of memory arrays 210-216 corresponds to the same bit line and/or word line in each of the memory arrays 210-216. For example, a bit stored in a memory cell 312 at the junction of word line "0" and bit line "0" may be selected from each of the first plurality of memory arrays 210-216.

As shown in FIG. 4, a bit D1, D2, D3, D4 may be selected from each of memory array 210-216, respectively. Each of these bits may be input to the selection circuit 400 of FIG. 4.

In step 506, one of the first plurality of memory arrays 210-216 is selected. More specifically, the signals S1, S2, S3, S4 generated by the decoder 402 (FIG. 4) are input to the multiplexer 404. As stated, each signal S1, S2, S3, S4 may correspond to one of the plurality of memory arrays 210-216 from which a bit was selected in step 504, and the signals S1, S2, S3, S4 may serve as select signals. Based on the select signals S1, S2, S3, S4, either the data signal D1, D2, D3, or D4 (e.g., the bit selected from each memory array in step 504) input to the multiplexer 404 is output by the multiplexer 404 on the ABIST dot line 408.

In one embodiment, only one of the select signals S1-S4 at a time will be of a high logic state so that only one bit from one of the memory arrays (e.g., the "selected" memory array) is output by the multiplexer 404. For example, if select signal S1 is of a high logic state (e.g., "1") and select signals S2, S3, and S4 are of a low logic state (e.g., "0"), memory array 210 is selected (e.g., the bit from memory array 210 is selected to be output from the multiplexer 404). Because select signal S1 has a high logic state, the second NFET N2 turns on. Likewise, because select signals S2, S3, S4 have a low logic state, NFETs N4, N6, and N8 are off.

As mentioned above, in at least one embodiment, the initial state value of the output of the multiplexer 404 (e.g., the initial value of the ABIST dot output line 408) is of a high logic state (e.g., via pull-up circuitry). Accordingly, if the bit output via the global dot line 318 of the first memory array 210 has a high logic state, the gate of the first NFET N1 will be low, the first NFET N1 will be off, and the ABIST dot line 408 will remain in its initial state (e.g., high). Alternatively, if the bit output via the global dot line 318 of the first memory array 210 has a low logic state, the gate of the first NFET N1 will be high, the first NFET N1 will turn on, and the ABIST dot line 218 will be pulled low via the first and second NFETs N1, N2. Bits of the other memory arrays may be similarly output to the ABIST dot line 408. In this manner, the output signal of the multiplexer 404 will match the selected input data signal (e.g., the bit selected from one of the memory arrays in step 504) of the multiplexer 404 for the selected one of the plurality of memory arrays 210-216.

In step 508, the selected bit from the selected memory array is stored. More specifically, the bit selected to be output from a memory array, which was selected based on a select signal, may be stored in the observation latch 232 The data output (e.g., the ABIST dot line 408) of the multiplexer 404 may be input to the observation latch 232 to be stored. In step 510, the method 500 of FIG. 5 ends.

A bit from one of the second plurality of memory arrays 220-226 may be similarly selected and stored in the second observation latch 234. Selection of a bit from the first plurality of memory arrays 210-216 and selection of a bit form the second plurality of memory arrays 220-226 may be performed simultaneously or in any order. As stated, a plurality of the selection circuits 400 of FIG. 4 may be employed (e.g., in parallel) to simultaneously read out all bits of a memory array and to store the bits in an observation latch.

To perform ABIST testing a data pattern may be written into one or more of the memory arrays 210-216 and/or 220-226 and selectively read out and stored in the observation latch 232 and/or 234 (e.g., using the method 500 of FIG. 5). The contents of the respective observation latch then may be compared to the original data pattern to test proper operation of the selected memory array.

Through the use of the novel IC chip 200 and method 500 of FIG. 5, ABIST testing may be performed on one or more memory arrays with a reduced number of latches. For example, if the IC chip 200 performs multiplexing on the global dot lines from each of four memory arrays, the number of latches needed in the IC chip may be reduced by a factor of 4. As mentioned above, reducing the number of latches included in the IC chip 200 reduces the floor plan area used by ABIST test circuitry and allows chip real estate to be used more efficiently.

The foregoing description discloses only exemplary embodiments of the invention. Modifications of the above-disclosed apparatus and methods which fall within the scope of the invention will be readily apparent to those of ordinary skill in the art. For instance, the method 500 of FIG. 5 may be performed simultaneously on more than one plurality of memory arrays. In one embodiment, a memory array from a first plurality of memory arrays and a memory array from a second plurality of memory arrays may be grouped in a set. In this manner, an ABIST test may be performed simultaneously on memory arrays included in the same set (e.g., memory array 210 and memory array 220 of FIG. 2).

Further, although FIG. 2 only discloses two memory arrays (e.g., memory array 210 and memory array 220) in a set, a set may include more than two memory arrays. Additionally, although the present methods and apparatus disclose performing 4-to-1 multiplexing on the global dot lines of four memory arrays, global dot lines from a larger or smaller number of memory arrays may be multiplexed.

Accordingly, while the present invention has been disclosed in connection with exemplary embodiments thereof, it should be understood that other embodiments may fall within the spirit and scope of the invention as defined by the following claims.

The invention claimed is:

1. A method for testing an integrated circuit (IC) comprising:
    selecting a bit during an ABIST test from each of a plurality of memory arrays formed on an IC chip;
    selecting one of the plurality of memory arrays on the IC chip; and
    storing the selected bit from the selected memory array in a component of the IC chip wherein an outcome of the ABIST test is determined based on the stored selected bit.

2. The method of claim 1 wherein selecting a bit from each of a plurality of memory arrays includes selecting a wordline in each of the plurality of memory arrays.

3. The method of claim 1 wherein selecting a bit from each of a plurality of memory arrays includes overwriting an initial state bit value of a selection circuit with a value of the selected bit.

4. The method of claim 1 wherein storing the selected bit from the selected memory array includes storing the selected bit from the selected memory array in a latch.

5. The method of claim 4 wherein storing the selected bit from the selected memory array includes one of storing an initial state bit value of an output of a selection circuit and storing a modified initial state bit value of the output of the selection circuit in the latch.

6. The method of claim 1 wherein selecting a bit from each of a plurality of memory arrays formed on an integrated circuit chip, selecting one of the plurality of memory arrays, and storing the selected bit from the selected memory array are performed during an ABIST test of the integrated circuit chip.

7. A method for testing an integrated circuit (IC) comprising:
    selecting a bit during an ABIST test from each of a first and second plurality of memory arrays formed on an IC chip;
    selecting one memory array from each of the first and second plurality of memory arrays of the IC chip; and
    storing the selected bit from the selected memory array for each of the first and second plurality of memory arrays in a component of the IC chip wherein an outcome of the ABIST test is determined based on the stored selected bit.

8. The method of claim 7 wherein selecting a bit from each of the first and second plurality of memory arrays includes selecting a wordline in each of the first and second plurality of memory arrays.

9. The method of claim 7 wherein selecting a bit from each of the first and second plurality of memory arrays includes:
    overwriting a first initial state bit value with a value of the selected bit from the selected memory array of the first plurality of memory arrays; and
    overwriting a second initial state bit value with a value of the selected bit from the selected memory array of the second plurality of memory arrays.

10. The method of claim 7 wherein storing the selected bit from the selected memory array for each of the first and second plurality of memory arrays includes:
    storing the selected bit from the selected memory array of the first plurality of memory arrays in a first latch; and
    storing the selected bit from the selected memory array of the second plurality of memory arrays in a second latch.

11. The method of claim 10 wherein storing the selected bit from the selected memory array of the first plurality of memory arrays includes one of storing an initial state bit value of an output of a first selection circuit and storing a modified initial state value of the output of the first selection circuit in a first latch; and
    wherein storing the selected bit from the selected memory array of the second plurality of memory arrays includes one of storing an initial state bit value of an output of a second selection circuit and storing a modified initial state value of the output of the second selection circuit in a second latch.

12. The method of claim 7 wherein selecting a bit from each of a first and second plurality of memory arrays formed on an IC chip, selecting one memory array from each of the first and second plurality of memory arrays, and storing the selected bit from the selected memory array for each of the first and second plurality of memory arrays are performed during an ABIST test of the IC chip.

* * * * *